United States Patent
Yuan et al.

(10) Patent No.: US 11,114,010 B2
(45) Date of Patent: Sep. 7, 2021

(54) SHIFT REGISTER, METHOD FOR DRIVING SAME, GATE DRIVING CIRCUIT, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Zhidong Yuan, Beijing (CN); Yongqian Li, Beijing (CN); Can Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/004,688

(22) Filed: Aug. 27, 2020

(65) Prior Publication Data
US 2021/0005127 A1 Jan. 7, 2021

Related U.S. Application Data

(63) Continuation of application No. 16/550,848, filed on Aug. 26, 2019, now Pat. No. 10,789,871.

(30) Foreign Application Priority Data

Jan. 2, 2019 (CN) .......................... 201910014624.1

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
CPC ............. G09G 3/20; G09G 2300/0408; G09G 2310/0267; G09G 2310/0286; G09G 2310/08; G11C 19/28
See application file for complete search history.

(56) References Cited

U.S. PATENT DOCUMENTS

2019/0058843 A1  2/2019 Suzuki et al.
2019/0059156 A1  2/2019 Kwon et al.
(Continued)

*Primary Examiner* — Sejoon Ahn
(74) *Attorney, Agent, or Firm* — Brooks Kushman P.C.

(57) ABSTRACT

A circuit includes an input sub-circuit configured to transmit an input signal from an input signal terminal to a feedback node under control of a first clock signal from a first clock signal terminal; a pull-up node control sub-circuit configured to transmit a feedback signal of the feedback node to a pull-up node under control of a first clock signal from the first clock signal terminal; a feedback sub-circuit configured to transmit a first voltage signal from a first voltage signal terminal to the feedback node under control of the pull-up node; an output sub-circuit configured to transmit a second clock signal from a second clock signal terminal to an output signal terminal under control of the pull-up node; and a pull-down sub-circuit configured to transmit a second voltage signal from a second voltage signal terminal to the output signal terminal under control of a pull-down node.

20 Claims, 10 Drawing Sheets

(52) U.S. Cl.
CPC ............... *G09G 2310/0267* (2013.01); *G09G 2310/0286* (2013.01); *G09G 2310/08* (2013.01)

(56) References Cited

U.S. PATENT DOCUMENTS

| | | |
|---|---|---|
| 2019/0064620 A1 | 2/2019 | Yamamoto |
| 2019/0065000 A1 | 2/2019 | Kim et al. |
| 2020/0013848 A1* | 1/2020 | Moon .................. H01L 27/3248 |
| 2020/0013986 A1* | 1/2020 | Li ........................ G09G 3/3208 |
| 2020/0020274 A1* | 1/2020 | Yue ........................... G09G 3/32 |

* cited by examiner

SHIFT REGISTER, METHOD FOR DRIVING SAME, GATE DRIVING CIRCUIT, AND DISPLAY DEVICE

CROSS-REFERENCE TO RELATED APPLICATIONS

This application is a continuation of U.S. patent application Ser. No. 16/550,848, filed Aug. 26, 2019, which claims priority to Chinese Patent Application No. 201910014624.1 filed on Jan. 2, 2019, which are incorporated herein by reference in their entireties.

TECHNICAL FIELD

The present disclosure relates to the field of display technology, and more particularly to a shift register, a method for driving the shift register, a gate driving circuit and a display device.

BACKGROUND

With the wide use of technologies of liquid crystal display (LCD) and organic light emitting diode display (OLED), a gate driving technology as one of key technologies common to both of them has naturally become a major concern. At present, it is common to use a Gate Driver on Array (GOA) technology, in which a gate driving circuit is formed directly on an array substrate together with a thin film transistor (TFT) array. The application of the GOA technology allows the gate driving circuit to be directly formed around a panel, thereby reducing the complexity of the procedure as well as the product cost. In addition, it also improves the integration of the display panel, makes the panel thinner and enables a narrow bezel design.

SUMMARY

In a first aspect, embodiments of the present disclosure provide a circuit, including: an input sub-circuit, coupled to a first clock signal terminal, an input signal terminal and a feedback node, and configured to transmit an input signal from the input signal terminal to the feedback node under the control of a first clock signal from the first clock signal terminal; a pull-up node control sub-circuit, coupled to the first clock signal terminal, the feedback node and a pull-up node, and configured to transmit a feedback signal of the feedback node to the pull-up node under the control of a first clock signal from the first clock signal terminal; a feedback sub-circuit, coupled to the pull-up node, a first voltage signal terminal and the feedback node, and configured to transmit a first voltage signal from the first voltage signal terminal to the feedback node under the control of the pull-up node; an output sub-circuit, coupled to the pull-up node and a free-end terminal, and configured to transmit a first signal to the free-end terminal under the control of the pull-up node; and a pull-down sub-circuit, coupled to the free-end terminal, and configured to transmit a second signal which is different from the first signal to the free-end terminal.

According to some possible embodiments of the present disclosure, the pull-up node control sub-circuit includes: a first transistor having a control terminal coupled to the first clock signal terminal, a first terminal coupled to the feedback node, and a second terminal coupled to the pull-up node.

According to some possible embodiments of the present disclosure, the feedback sub-circuit includes: a second transistor having a control terminal coupled to the pull-up node, a first terminal coupled to the first voltage signal terminal, and a second terminal coupled to the feedback node; and a first capacitor having one end coupled to the pull-up node and the other end coupled to the first voltage signal terminal.

According to some possible embodiments of the present disclosure, the input sub-circuit includes: a third transistor having a control terminal coupled to the first clock signal terminal, a first terminal coupled to the input signal terminal, and a second terminal coupled to the feedback node.

According to some possible embodiments of the present disclosure, the output sub-circuit includes: a fourth transistor having a control terminal coupled to the pull-up node, a first terminal coupled to the second clock signal terminal, and a second terminal coupled to the free-end terminal; and a second capacitor having one end coupled to the pull-up node and the other end coupled to the free-end terminal.

According to some possible embodiments of the present disclosure, the pull-down sub-circuit includes: a fifth transistor having a control terminal coupled to the first clock signal terminal, a first terminal coupled to a second voltage signal terminal, and a second terminal coupled to the free-end terminal.

According to some possible embodiments of the present disclosure, the shift register further includes: a reset sub-circuit, coupled to a reset signal terminal, a third voltage signal terminal and the pull-up node, and configured to transmit a third voltage signal from the third voltage signal terminal to the pull-up node under the control of a reset signal from the reset signal terminal.

According to some possible embodiments of the present disclosure, the reset sub-circuit includes: a sixth transistor having a control terminal coupled to the reset signal terminal, a first terminal coupled to the third voltage signal terminal, and a second terminal coupled to the pull-up node.

According to some possible embodiments of the present disclosure, the third voltage signal from the third voltage signal terminal is substantially identical to the second voltage signal from the second voltage signal terminal.

According to some possible embodiments of the present disclosure, each transistor is an N-type transistor, the first voltage signal is a high level signal, and the second and third voltage signals are low level signals.

According to some possible embodiments of the present disclosure, the first and second clock signals each have a duty cycle less than 50%.

According to some possible embodiments of the present disclosure, the first and second clock signals each have a duty cycle equal to 50%.

In a second aspect, embodiments of the present disclosure further provide a circuit including: an input sub-circuit, coupled to a first clock signal terminal, an input signal terminal and a feedback node, and configured to transmit an input signal from the input signal terminal to the feedback node under the control of a first clock signal from the first clock signal terminal; a pull-up node control sub-circuit, coupled to the first clock signal terminal, the feedback node and a pull-up node, and configured to transmit a feedback signal of the feedback node to the pull-up node under the control of a first clock signal from the first clock signal terminal; a feedback sub-circuit, coupled to the pull-up node, a first voltage signal terminal and the feedback node, and configured to transmit a first voltage signal from the first voltage signal terminal to the feedback node under the control of the pull-up node; an output sub-circuit, coupled to the pull-up node, a second clock signal terminal and an output signal terminal, and configured to transmit a second clock signal from the second clock signal terminal to the output signal terminal under the control of the pull-up node; and a pull-down sub-circuit, coupled to a pull-down node, a second voltage signal terminal and the output signal terminal, and configured to transmit a second voltage signal from the second voltage signal terminal to the output signal terminal under the control of the pull-down node.

According to some possible embodiments of the present disclosure, the pull-up node control sub-circuit includes: a first transistor having a control terminal coupled to the first clock signal terminal, a first terminal coupled to the feedback node, and a second terminal coupled to the pull-up node.

According to some possible embodiments of the present disclosure, the feedback sub-circuit includes: a second transistor having a control terminal coupled to the pull-up node, a first terminal coupled to the first voltage signal terminal, and a second terminal coupled to the feedback node; and a first capacitor having one end coupled to the pull-up node and the other end coupled to the first voltage signal terminal.

According to some possible embodiments of the present disclosure, the input sub-circuit includes: a third transistor having a control terminal coupled to the first clock signal terminal, a first terminal coupled to the input signal terminal, and a second terminal coupled to the feedback node.

According to some possible embodiments of the present disclosure, the output sub-circuit includes: a fourth transistor having a control terminal coupled to the pull-up node, a first terminal coupled to the second clock signal terminal, and a second terminal coupled to the output signal terminal; and a second capacitor having one end coupled to the pull-up node and the other end coupled to the output signal terminal.

According to some possible embodiments of the present disclosure, the pull-down sub-circuit includes: a fifth transistor having a control terminal coupled to the pull-down node, a first terminal coupled to the second voltage signal terminal, and a second terminal coupled to the output signal terminal.

According to some possible embodiments of the present disclosure, the shift register further includes: a reset sub-circuit, coupled to a reset signal terminal, a third voltage signal terminal and the pull-up node, and configured to transmit a third voltage signal from the third voltage signal terminal to the pull-up node under the control of a reset signal from the reset signal terminal.

According to some possible embodiments of the present disclosure, the reset sub-circuit includes: a sixth transistor having a control terminal coupled to the reset signal terminal, a first terminal coupled to the third voltage signal terminal, and a second terminal coupled to the pull-up node.

According to some possible embodiments of the present disclosure, the third voltage signal from the third voltage signal terminal is substantially identical to the second voltage signal from the second voltage signal terminal.

According to some possible embodiments of the present disclosure, each transistor is an N-type transistor, the first voltage signal is a high level signal, and the second and third voltage signals are low level signals.

According to some possible embodiments of the present disclosure, the first and second clock signals each have a duty cycle less than 50%.

According to some possible embodiments of the present disclosure, the first and second clock signals each have a duty cycle equal to 50%.

BRIEF DESCRIPTION OF THE DRAWINGS

The above and other objects, features and advantages of the present disclosure will become more apparent from some optional embodiments of the present disclosure illustrated hereinafter in conjunction with the drawings, in which.

DETAILED DESCRIPTION

Figure 1:
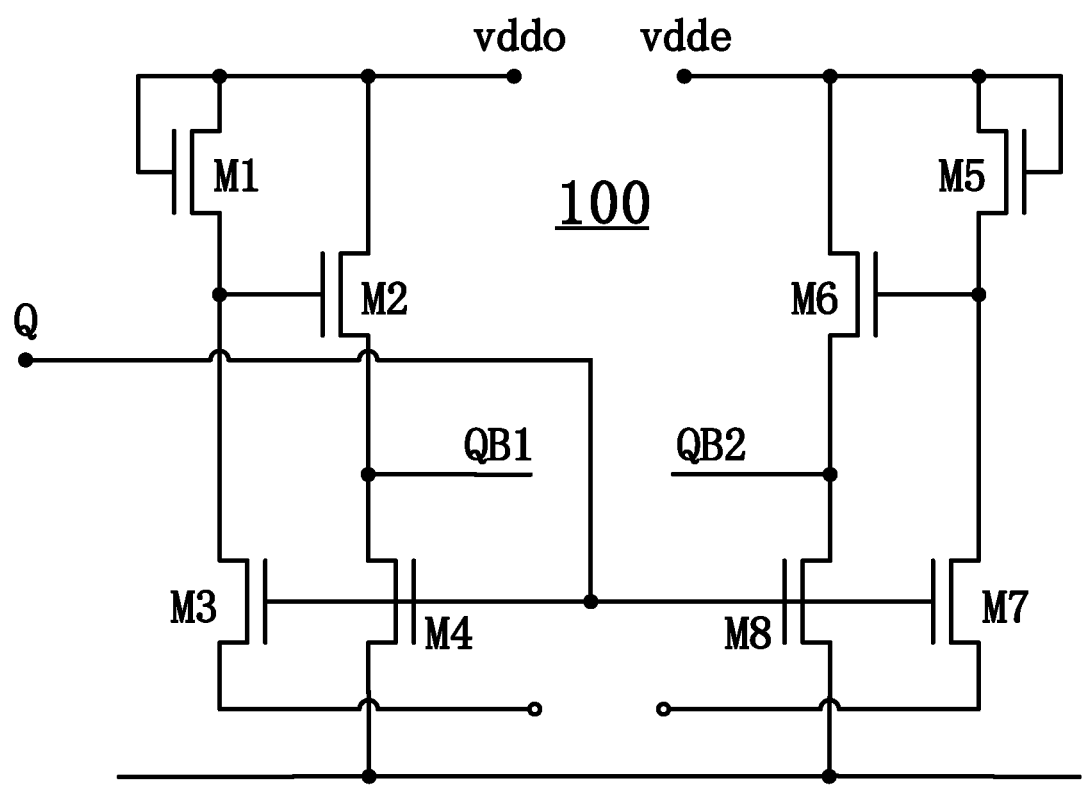
FIG. 1 is a schematic diagram showing a partial exemplary configuration of a shift register having double inverters of a Darlington structure.

A part of the embodiments of the present disclosure will be described in detail hereinafter with reference to the accompanying drawings, and details and functions that are not necessary for the present disclosure are omitted in the description in order to avoid obscuring the understanding of the present disclosure. In the present description, the following various embodiments for explaining the principles of the present disclosure are merely illustrative and should not be construed as limiting the scope of the disclosure in any manner. The following description made with reference to the drawings is intended to help the complete understanding of the illustrative embodiments of the present disclosure defined by the claims and equivalents thereof. Various details are included in the description to assist the understanding, but these details should be considered merely as illustrative. Accordingly, it will be appreciated for those skilled in the art that various changes and modifications may be made to the embodiments described herein without departing from the scope and spirit of the present disclosure. In addition, the description of well-known functions and constructions is omitted for clarity and conciseness. In addition, the same reference signs are used for the same or similar functions, devices and/or operations throughout the drawings. Moreover, the parts in the drawings are not necessarily drawn to scale. In other words, relative ratios of sizes, lengths and the like of the respective parts in the drawings do not necessarily correspond to actual ratios thereof.

In the present disclosure, the terms "comprising", "including" and other variants thereof are intended to be inclusive and not limiting; the term "or" has an inclusive meaning and is intended to be "and/or". In addition, in the following description of the present disclosure, such orientation words as "up", "down", "left" and "right" are each used to represent a relative positional relationship to assist those skilled in the art in understanding the embodiments of the present disclosure, and those skilled in the art should therefore understand that "up"/"down" in one direction may become "down"/"up" in the opposite direction, and may become other positional relationships in another direction, such as "left"/"right", etc.

Hereinafter, embodiments of the present disclosure will be described in detail by taking their application to a gate driving circuit of a display device as an example. However, it should be understood by those skilled in the art that the application field of the present disclosure is not limited thereto. In fact, a shift register or the like according to the embodiments of the present disclosure can be applied to other fields in which the shift register is required to be used.

Further, although an N-type transistor is described as an example of a transistor in the following description, the present disclosure is not limited thereto. In fact, as can be understood by those skilled in the art, when one or more of transistors as mentioned below are P-type transistors, the technical solution of the present application can also be implemented and it is only required to adjust settings of levels/coupling relationships accordingly.

It is clear that in the related art, for a GOA based on an oxide backplane, negative drift is very likely to occur due to characteristics of a thin film transistor (TFT) itself, especially under a negative bias temperature stress (NBTS) or illumination for a long time. Therefore, in order to ensure high reliability of the circuit under these conditions, inverters of a Darlington structure type are required in the GOA circuit design, and in order to avoid a long-term direct current (DC) stress, a design in which the two inverters can alternate is required. As a result, the structure of the GOA circuit is complicated, which is not conducive to the implementation of a highly-integrated circuit.

FIG. 1 is a schematic diagram showing a part of an exemplary configuration of a shift register 100 having double inverters of a Darlington structure. This part of the shift register 100 adopts the inverters of a Darlington structure type. Moreover, in order to avoid long-term DC stress, the two inverters, such as a left inverter formed by a Darlington structure based on M1 and M2 and a right inverter formed by a Darlington structure based on M5 and M6, are required to alternate. With such inverters, regardless of whether a Q node is at a high or low level, it is possible to realize a corresponding inverting function at both QB1 and QB2 nodes, i.e., a corresponding low or high level. It is thus possible for the shift register 100 shown in FIG. 1 to maintain a voltage inversion relationship between pull-up and pull-down nodes by using such inverters.

However, as shown in FIG. 1, the design of such a shift register requires eight N-type TFTs M1 to M8, and two DC voltage signals vddo and vdde. As described above, in this shift register design, its complicated structure is highly disadvantageous for the implementation of a highly-integrated circuit.

Hereinafter, a shift register, a method for driving the shift register, a gate driving circuit, and a display device according to embodiments of the present disclosure will be described in detail with reference to FIGS. 2 to 10. The embodiments of the present disclosure can provide a gate driving circuit, a Gate In Panel (GIP) circuit, a shift register and the like, which can be applied to an oxide backplane and have simple structures and high reliability. In addition, the location of their storage capacitor is different from that in the traditional GOA, which can ensure a lossless output while reducing noises.

Hereinafter, a shift register according to an embodiment of the present disclosure will be described in detail in conjunction with FIG. 2.

Figure 2:
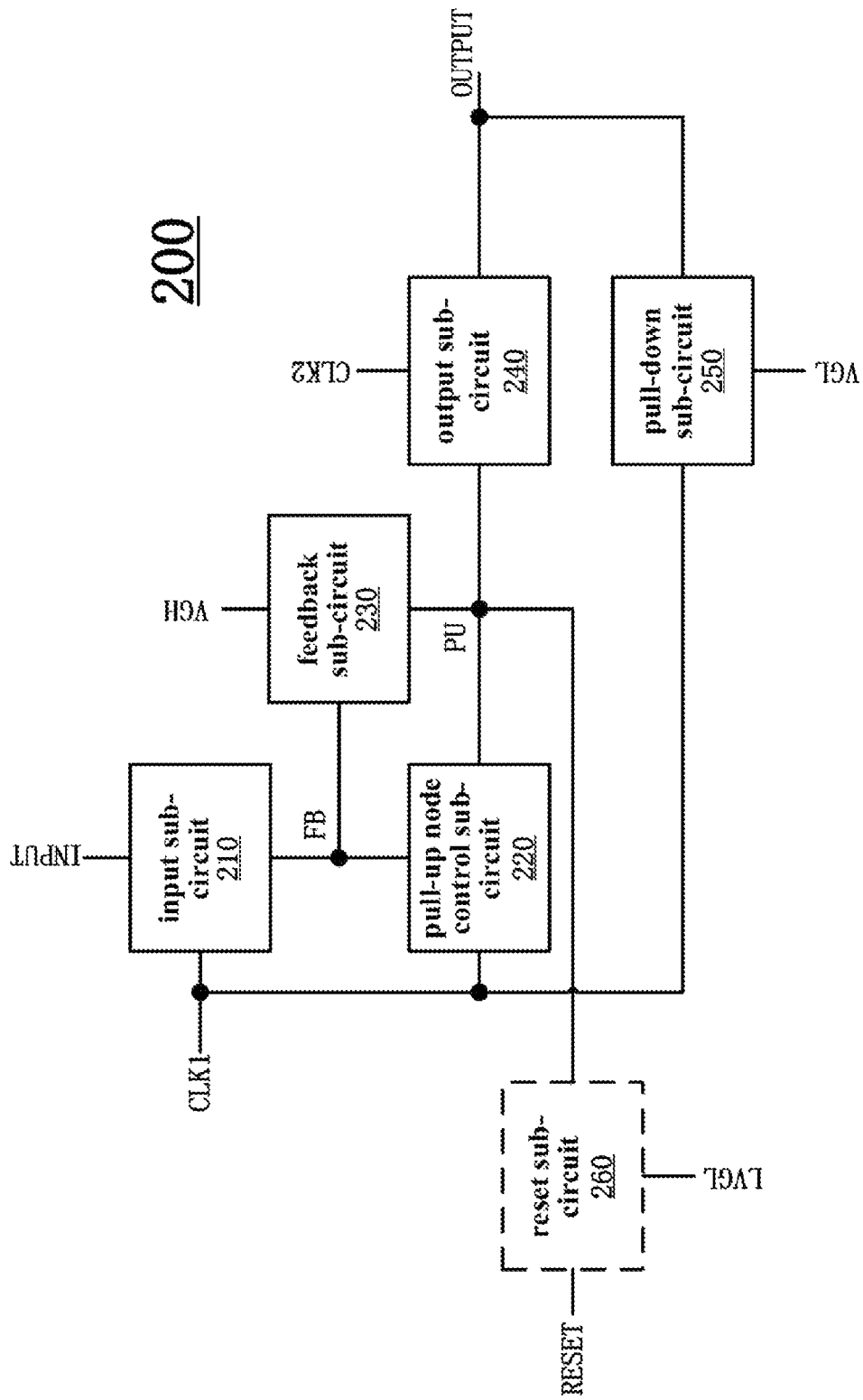
FIG. 2 is a schematic diagram showing an exemplary configuration of a shift register according to an embodiment of the present disclosure.

FIG. 2 is a schematic diagram showing an exemplary configuration of a shift register 200 according to an embodiment of the present disclosure. As shown in FIG. 2, the shift register 200 may include an input sub-circuit 210, a pull-up node control sub-circuit 220, a feedback sub-circuit 230, an output sub-circuit 240, and a pull-down sub-circuit 250. Moreover, in some embodiments, the shift register 200 may further include an optional reset sub-circuit 260.

In some embodiments, the input sub-circuit 210 may be coupled to a first clock signal terminal CLK1, an input signal terminal INPUT and a feedback node FB, and configured to be able to transmit an input signal from the input signal terminal INPUT to the feedback node FB under the control of a first clock signal from the first clock signal terminal CLK1.

In some embodiments, the pull-up node control sub-circuit 220 may be coupled to the first clock signal terminal CLK1, the feedback node FB and a pull-up node PU, and configured to be able to transmit a feedback signal of the feedback node FB to the pull-up node PU under the control of a first clock signal from the first clock signal terminal CLK1.

In some embodiments, the feedback sub-circuit 230 may be coupled to the pull-up node PU, a first voltage signal terminal VGH and the feedback node FB, and configured to be able to transmit a first voltage signal from the first voltage signal terminal VGH to the feedback node FB under the control of the pull-up node PU.

In some embodiments, the output sub-circuit 240 may be coupled to the pull-up node PU, a second clock signal terminal CLK2, and an output signal terminal OUTPUT, and configured to be able to transmit a second clock signal from the second clock signal terminal CLK2 to the output signal terminal OUTPUT under the control of the pull-up node PU.

In some embodiments, the pull-down sub-circuit 250 is coupled to the first clock signal terminal CLK1, a second voltage signal terminal VGL and the output signal terminal OUTPUT, and is configured to be able to transmit a second voltage signal from the second voltage signal terminal VGL to the output signal terminal OUTPUT under the control of a first clock signal from the first clock signal terminal CLK1.

By adopting the shift register design as described above, the control of a potential of the pull-up node PU can be realized by replacing the pull-down node with a clock signal from the first clock signal terminal CLK1. As a result, the circuit design is simplified, which is suitable for high PPI display and narrow bezel requirements.

Moreover, as previously explained, the shift register 200 may further include an optional reset sub-circuit 260, as shown in FIG. 2. The reset sub-circuit 260 may be coupled to a reset signal terminal RESET, a third voltage signal terminal LVGL and the pull-up node PU, and configured to be able to transmit a third voltage signal from the third voltage signal terminal LVGL to the pull-up node PU under the control of a reset signal from the reset signal terminal RESET. By using the reset sub-circuit 260, it is possible to perform better noise cancellation on the pull-up node to make a waveform of an output signal which is finally outputted more stable.

Next, a specific implementation of the shift register 200 as shown in FIG. 2 will be described in detail in conjunction with FIG. 3. It should be noted that the implementation of the shift register 200 as shown in FIG. 2 is not limited to the embodiment shown in FIG. 3, but may include various sub-circuits implemented in other manners.

Figure 3:
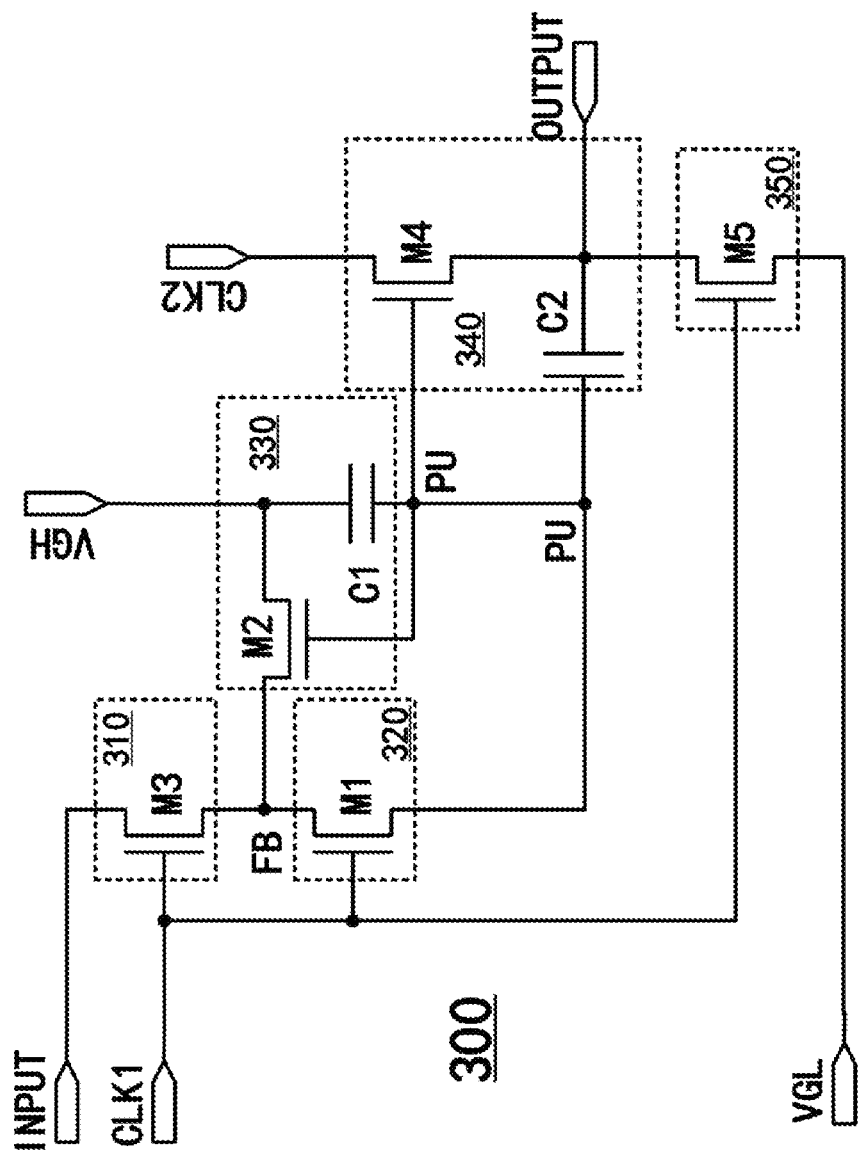
FIG. 3 is a schematic diagram showing an exemplary specific configuration of the shift register shown in FIG. 2.

FIG. 3 is a schematic diagram showing an exemplary specific configuration 300 of the shift register 200 shown in FIG. 2. Similar to the shift register 200 shown in FIG. 2, the shift register 300 may include an input sub-circuit 310, a pull-up node control sub-circuit 320, a feedback sub-circuit 330, an output sub-circuit 340, and a pull-down sub-circuit 350, as shown in FIG. 3.

In some embodiments, the pull-up node control sub-circuit 320 may include a first transistor M1, a control terminal of which may be coupled to the first clock signal terminal CLK1, a first terminal of which may be coupled to the feedback node FB, and a second terminal of which may be coupled to the pull-up node PU. In other words, the pull-up node control sub-circuit 320 may be configured to be able to transmit a feedback signal of the feedback node FB to the pull-up node PU under the control of a first clock signal from the first clock signal terminal CLK1.

In some embodiments, the feedback sub-circuit 330 may include a second transistor M2, a control terminal of which may be coupled to the pull-up node PU, a first terminal of which may be coupled to the first voltage signal terminal VGH, and a second terminal of which may be coupled to the feedback node FB. Furthermore, the feedback sub-circuit 330 may further include a first capacitor C1, one end of which may be coupled to the pull-up node PU, and the other end of which may be coupled to the first voltage signal terminal VGH. In other words, the feedback sub-circuit 330 may be configured to be able to transmit a first voltage signal from the first voltage signal terminal VGH to the feedback node FB under the control of the pull-up node PU.

In some embodiments, the input sub-circuit 310 may include a third transistor M3, a control terminal of which may be coupled to the first clock signal terminal CLK1, a first terminal of which may be coupled to the input signal terminal INPUT, and a second terminal of which may be coupled to the feedback node FB. In other words, the input sub-circuit 310 may be configured to be able to transmit an input signal from the input signal terminal INPUT to the feedback node FB under the control of the first clock signal from the first clock signal terminal CLK1.

In some embodiments, the output sub-circuit 340 may include a fourth transistor M4, a control terminal of which may be coupled to the pull-up node PU, a first terminal of which may be coupled to the second clock signal terminal CLK2, and a second terminal of which may be coupled to the output signal terminal OUTPUT. In addition, the output sub-circuit 340 may further include a second capacitor C2, one end of which may be coupled to the pull-up node PU, and the other end of which may be coupled to the output signal terminal OUTPUT. In other words, the output sub-circuit 340 may be configured to be able to transmit a second clock signal from the second clock signal terminal CLK2 to the output signal terminal OUTPUT under the control of the pull-up node PU.

In some embodiments, the pull-down sub-circuit 350 may include a fifth transistor M5, a control terminal of which may be coupled to the first clock signal terminal CLK1, a first terminal of which may be coupled to the second voltage signal terminal VGL, and a second terminal of which may be coupled to the output signal terminal OUTPUT. In other words, it can be configured to be able to transmit a second voltage signal from the second voltage signal terminal VGL to the output signal terminal OUTPUT under the control of a first clock signal from the first clock signal terminal CLK1.

Figure 4:
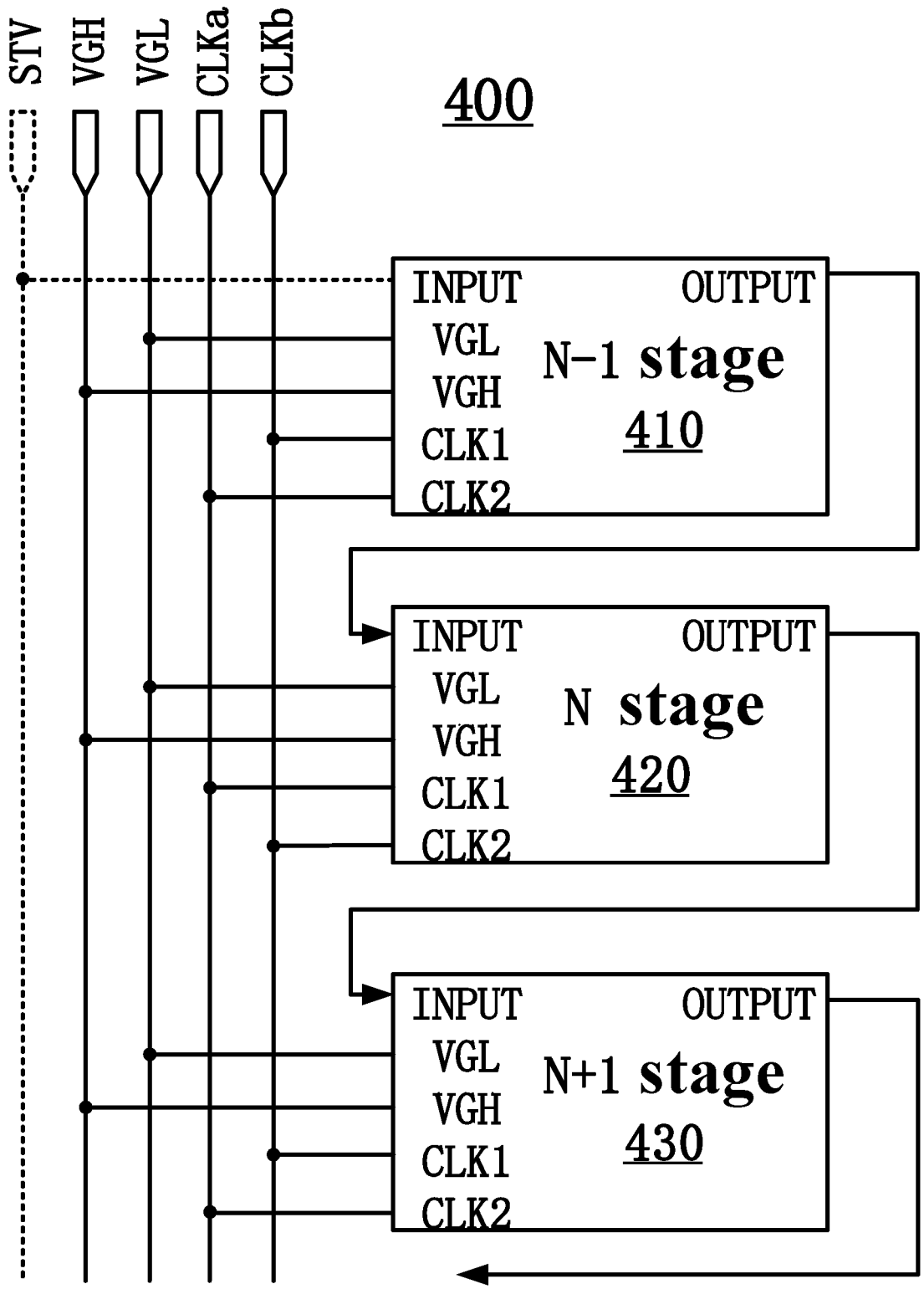
FIG. 4 is a schematic diagram showing an exemplary configuration of a gate driving circuit according to an embodiment of the present disclosure.
Figure 6:
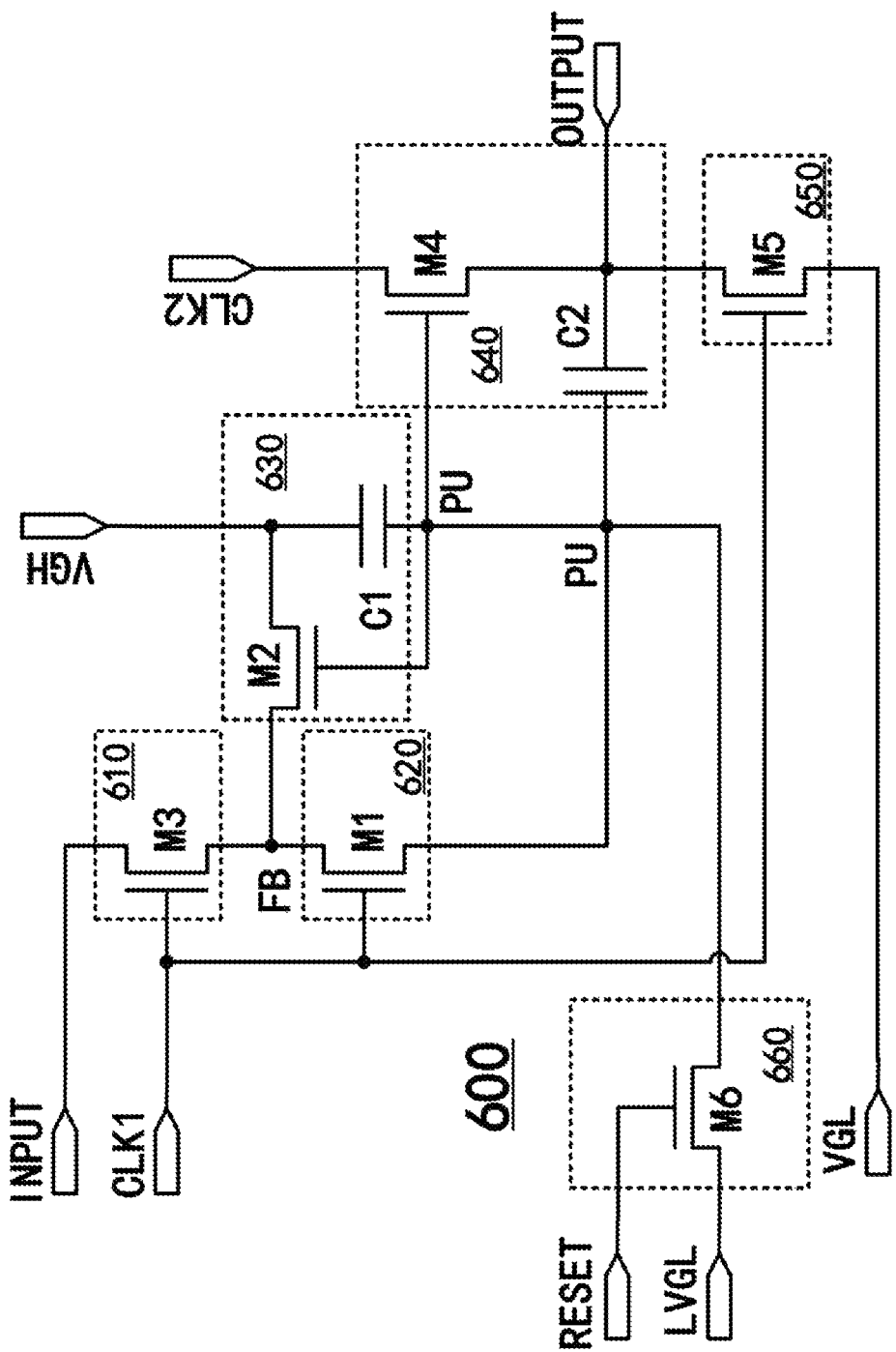
FIG. 6 is a schematic diagram showing another exemplary specific configuration of the shift register shown in FIG. 2.

Next, an exemplary configuration of a gate driving circuit according to an embodiment of the present disclosure will be described with reference to FIG. 4. FIG. 4 is a schematic diagram showing an exemplary configuration of a gate driving circuit 400 according to an embodiment of the present disclosure. The gate driving circuit 400 may include a plurality of shift registers 410, 420, 430, and the like, which are connected in cascade. While only three shift registers are shown in the embodiment as shown in FIG. 4, embodiments of the present disclosure are not limited thereto, and any number of shift registers may be employed. In some embodiments, each of the shift registers shown in FIG. 4 may be the shift register 200 as shown in FIG. 2, the shift register 300 as shown in FIG. 3, or a shift register 600 as shown in FIG. 6 later; however, the disclosure is not limited thereto. In some other embodiments, in the gate driving circuit 400 shown in FIG. 4, some of the shift registers may be the shift registers 200, 300, and/or 600 according to the embodiments of the present disclosure, and the others may be other shift registers which have been developed or will be developed in the future, such as the shift register 100.

As shown in FIG. 4, for each shift register (e.g., a shift register 420 at an $N^{th}$ stage), its input terminal INPUT (N) is coupled to an output signal terminal OUTPUT (N−1) of a shift register at an immediately preceding stage (e.g., a shift register 410 at an $(N-1)^{th}$ stage), its output signal terminal OUTPUT (N) is coupled to an input terminal INPUT (N+1) of a shift register at an immediately subsequent stage (e.g., a shift register 430 at an $(N+1)^{th}$ stage). Furthermore, an input terminal INPUT of a shift register at a first stage may, for example, be coupled to a StarT Vertical (STV) signal line to receive a STV signal indicating the start of scanning one frame of image (e.g., a STV indicated by a leftmost dotted line in FIG. 4).

Figure 5:
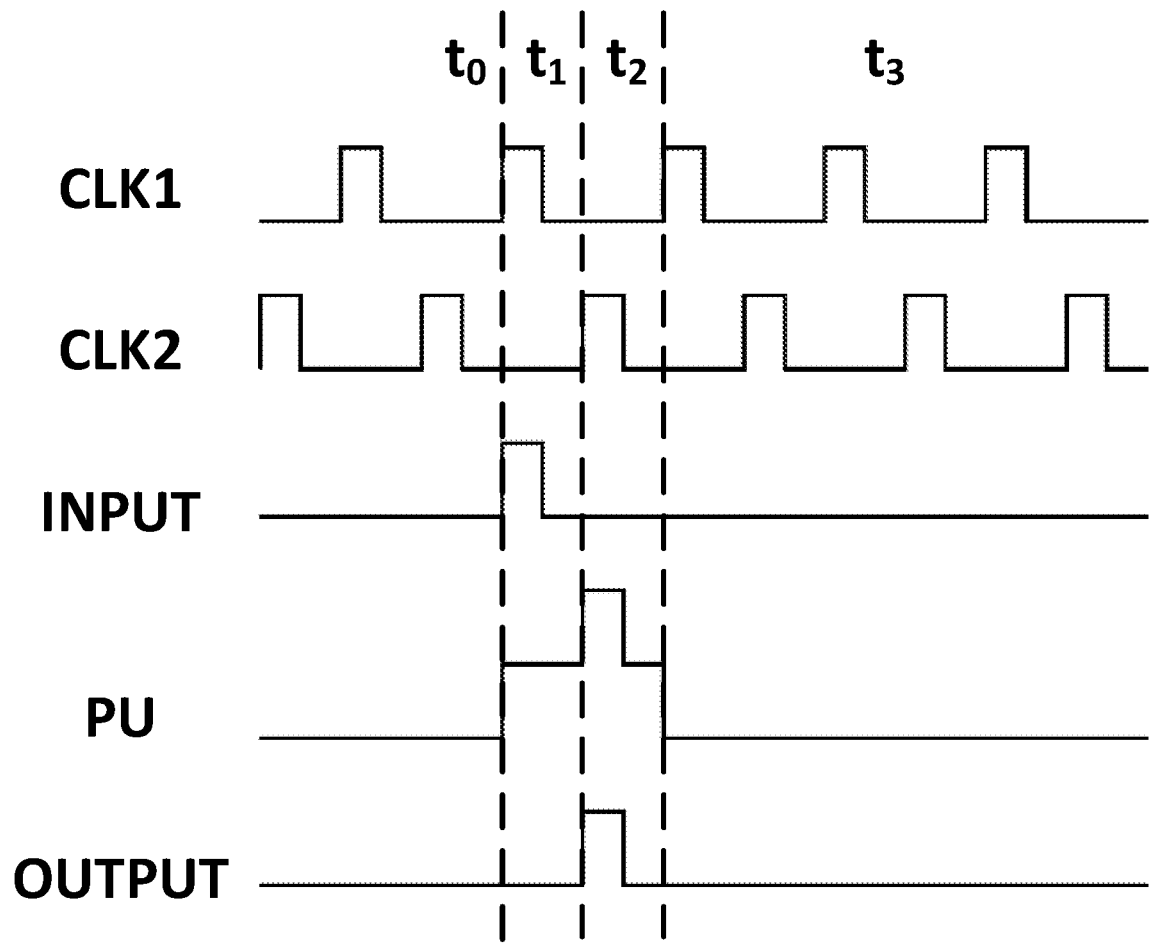
FIG. 5 shows an exemplary operation timing diagram of the shift register shown in FIG. 3.

Furthermore, as shown in FIG. 4, first and second clock signal terminals CLK1 and CLK2 of two adjacent shift registers (e.g., the shift register 420 at the $N^{th}$ stage and the shift register 410 at the $(N-1)^{th}$ stage or the shift register 430 at the $(N+1)^{th}$ stage) may be coupled to different clock signal lines CLKa and CLKb in different orders. In some embodiments, the CLKa and CLKb may provide clock signals with a same frequency and with waveforms that are out of phase with each other by, for example, half a clock cycle. For example, the first clock signal terminal CLK1 and the second clock signal terminal CLK2 of the shift register 420 at the $N^{th}$ stage are coupled to the CLKa and CLKb lines, respectively, and the first clock signal terminals CLK1 of the shift register 410 at the $(N-1)^{th}$ stage and the shift register 430 at the $(N+1)^{th}$ stage are coupled to the CLKb line and the second clock signal terminals CLK2 of the shift register 410 at the $(N-1)^{th}$ stage and the shift register 430 at the $(N+1)^{th}$ stage are coupled to the CLKa line, so that an operation timing as shown in FIG. 5 can be realized. Furthermore, also as shown in FIG. 4, the first voltage signal terminal VGH and the second voltage signal terminal VGL of each shift register may be respectively coupled to a VGH line and a VGL line, to receive a first voltage signal and a second voltage signal, respectively. In some embodiments, for example, when an N-type transistor is used to form the shift register, VGH may be a high level signal above a threshold voltage of the transistor and VGL may be a low level signal below the threshold voltage of the transistor.

Next, an operation timing of the shift register 300 will be described in detail in connection with FIG. 5 based on the specific configuration of the shift register 300 as shown in FIG. 3 and a cascade relationship as shown in the gate driving circuit 400 in FIG. 4.

FIG. 5 shows an exemplary operation timing diagram of the shift register shown in FIG. 3, which has a cascade relationship as shown in FIG. 4 with other shift registers.

As shown in FIG. 5, a period of one frame for the shift register 300 may be divided into four phases of $t_0$ to $t_3$. It should be noted that the embodiment shown in FIG. 5 only shows a case where a duty cycle of each clock signal is lower than 50%, but the shift register according to the embodiment of the present disclosure is also applicable to a clock signal with a duty cycle equal to 50%, as will be explained below in connection with FIG. 10. Therefore, the following description is made based only on the clock signal at the beginning of each phase (except for a preparation phase $t_0$) (i.e., a voltage level on the left side of each phase of $t_1$, $t_2$, and $t_3$ in FIG. 5) without loss of generality. As for the preparation phase $t_0$, it can be regarded as the last clock cycle of the third phase $t_3$ (the voltage level on the left side of this clock cycle is also considered).

In the preparation phase to, a low level may be inputted at the input signal terminal INPUT, a low level may be inputted at the first clock signal terminal CLK1, a high level may be inputted at the second clock signal terminal CLK2, and a low level may be outputted at the output signal terminal OUTPUT.

More specifically, in the preparation phase to, the low level is inputted at the first clock signal terminal CLK1 so that the first transistor M1, the third transistor M3, and the fifth transistor M5 are all turned off, thereby causing the pull-up node PU to maintain a voltage state of the third phase $t_3$ of a preceding frame. In other words, the pull-up node PU is maintained at the low level. Maintaining the pull-up node PU at the low level causes both the second transistor M2 and the fourth transistor M4 to remain turned off, and the turn-off of the fifth transistor M5 as previously mentioned causes the output signal terminal OUTPUT to maintain the voltage state of the third stage $t_3$ of the preceding frame, that is, a state of outputting the low level.

In the first stage $t_1$, a high level is inputted at the input signal terminal INPUT, a high level is inputted at the first clock signal terminal CLK1, a low level is inputted at the second clock signal terminal CLK2, and a low level is outputted at the output signal terminal OUTPUT.

More specifically, in the first phase $t_1$, the high level is inputted at the first clock signal terminal CLK1 so that the first transistor M1, the third transistor M3, and the fifth transistor M5 are all turned on, thereby causing the high level input signal from the input signal terminal INPUT to be transmitted to the pull-up node PU through the third transistor M3, the feedback node FB and the first transistor M1. Further, the high level of the pull-up node PU causes both the second transistor M2 and the fourth transistor M4 to be turned on. The turn-on of the second transistor M2 causes the high level from the first voltage signal terminal VGH to be transmitted to the feedback node FB, which makes the feedback node FB remain at the high level. In addition, the turn-on of the fourth transistor M4 causes the low-level clock signal from the second clock signal terminal CLK2 to be transmitted to the output signal terminal OUTPUT, and the turn-on of the fifth transistor M5 causes the low level from the second voltage signal terminal VGL to be transmitted to the output signal terminal OUTPUT as well, which causes the output signal terminal OUTPUT to output the low level. Moreover, both ends of the first capacitor C1 are at the high levels, and one end of the second capacitor C2 coupled to the pull-up node PU is at the high level, and the other end of the second capacitor C2 coupled to the output signal terminal OUTPUT is at the low level.

In the second phase $t_2$, a low level is inputted at the input signal terminal INPUT, a low level is inputted at the first clock signal terminal CLK1, a high level is inputted at the second clock signal terminal CLK2, and a high level is outputted at the output signal terminal OUTPUT.

More specifically, in the second phase $t_2$, the low level is inputted at the first clock signal terminal CLK1 so that the first transistor M1, the third transistor M3, and the fifth transistor M5 are all turned off, thereby preventing the pull-up node PU from being influenced by the input signal from the input signal terminal INPUT and the feedback node FB. In other words, the pull-up node PU is maintained at the high level. Maintaining the pull-up node PU at the high level causes both the second transistor M2 and the fourth transistor M4 to remain turned on. The turn-on of the fourth transistor M4 causes the high level second clock signal from the second clock signal terminal CLK2 to be transmitted to the output signal terminal OUTPUT, and at the same time the fifth transistor M5 remains turned off, so the output signal terminal OUTPUT can only output a high level. In addition, due to bootstrapping effect of the second capacitor C2, the level of the pull-up node PU is further increased, which causes the fourth transistor M4 to remain turned on and the output signal terminal OUTPUT continue to output the high level second clock signal from the second clock signal terminal CLK2.

In the third phase $t_3$, a low level is inputted at the input signal terminal INPUT, a high or low level is inputted at the first clock signal terminal CLK1, a low or high level is correspondingly inputted at the second clock signal terminal CLK2, and a low level is outputted at the output signal terminal OUTPUT.

More specifically, in the third phase $t_3$, if a high level is inputted at the first clock signal terminal CLK1 so that the first transistor M1, the third transistor M3, and the fifth transistor M5 are all turned on, the low level input signal from the input signal terminal INPUT will be transmitted to the pull-up node PU through the third transistor M3, the feedback node FB and the first transistor M1. Further, the low level of the pull-up node PU causes both the second transistor M2 and the fourth transistor M4 to be turned off. The turn-off of the fourth transistor M4 causes the output signal terminal OUTPUT to be affected only by the low level from the second voltage signal terminal VGL due to the fifth transistor M5 which is turned on. In other words, the output signal terminal OUTPUT outputs a low level.

In addition, in the third phase $t_3$, if a low level is inputted at the first clock signal terminal CLK1 so that the first transistor M1, the third transistor M3, and the fifth transistor M5 are all turned off, the pull-up node PU will maintain a voltage state of the preceding phase (i.e., the $t_3$ phase in which the high level is inputted at the first clock signal terminal CLK1). In other words, the pull-up node PU is maintained at the low level. Maintaining the pull-up node PU at the low level causes both the second transistor M2 and the fourth transistor M4 to remain turned off, and the turn-off of the fifth transistor M5 as previously mentioned causes the output signal terminal OUTPUT to maintain the voltage state of the preceding stage (i.e., the $t_3$ phase in which the high level is inputted at the first clock signal terminal CLK1), that is, a state of outputting a low level.

Further, in some embodiments, for example, in the case where duty cycles of the first and second clock signal terminals CLK1 and CLK2 are less than 50%, charging and boosting processes of the second capacitor C2 at this phase can also be achieved. Such processes will be described in detail below in conjunction with FIG. 10 based on FIGS. 3 to 5.

Figure 10:
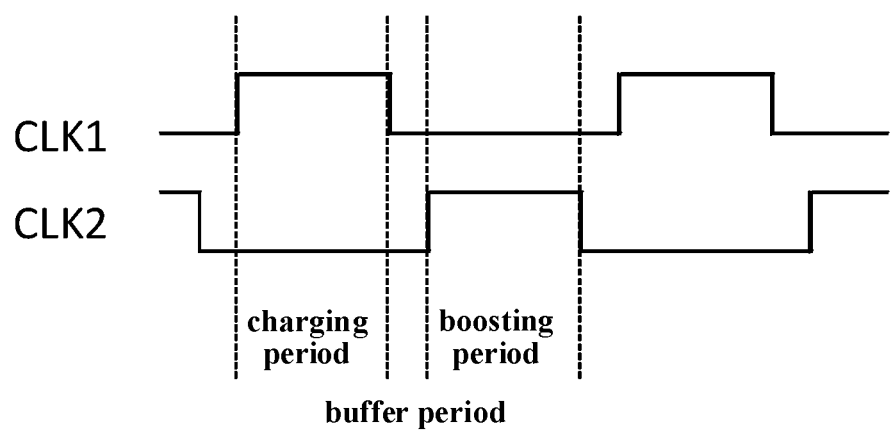
FIG. 10 is a timing diagram showing exemplary clock signals used in driving the shift register according to an embodiment of the present disclosure.

FIG. 10 is a timing diagram showing exemplary clock signals used in driving the shift register 300 according to an embodiment of the present disclosure. Similarly to the first phase $t_1$ as described above, when the first clock signal of the first clock signal terminal CLK1 is at a high level and the second clock signal of the second clock signal terminal CLK2 is at a low level, the second capacitor C2 is charged, that is, entering a charging period. Since the duty cycles of the clock signals are less than 50%, there is a buffer period from a later stage of the first phase $t_1$ until the second phase $t_2$, in which the first and second clock signals are both at the low level. During the buffer period, referring to FIG. 3, since the first and second clock signals are both at low levels, the first transistor M1, the third transistor M3, and the fifth transistor M5 are all turned off, thereby causing the second capacitor C2 and the pull-up node PU to be kept unchanged in their states, that is, the second capacitor C2 is still in the charging state, and the output signal terminal OUTPUT still outputs the low level signal. Next, returning to FIG. 10, when the first clock signal of the first clock signal terminal CLK1 is at a low level and the second clock signal of the second clock signal terminal CLK2 is at a high level, a voltage at an end of the second capacitor C2 on the side of the pull-up node is further increased, i.e., entering a boosting period. In other words, for the clock signal with the duty cycle less than 50%, it is also possible to raise the voltage of the pull-up node PU by the shift register design as described above, and thus to enable the output signal terminal OUTPUT to normally output the high level second clock signal from the second clock signal terminal CLK2.

By adopting the shift register design as described above, the control of the potential of the pull-up node PU can be realized by replacing the pull-down node with a clock signal from the first clock signal terminal CLK1. As a result, the circuit design is simplified, which is suitable for high PPI display and narrow bezel requirements.

Next, another specific implementation of the shift register 200 shown in FIG. 2 will be described in detail in conjunction with FIG. 6.

FIG. 6 is a schematic diagram showing an exemplary specific configuration 600 of the shift register 200 shown in FIG. 2. Similar to the shift register 200 shown in FIG. 2, the shift register 600 may include an input sub-circuit 610, a pull-up node control sub-circuit 620, a feedback sub-circuit 630, an output sub-circuit 640, and a pull-down sub-Circuit 650, as shown in FIG. 6. Unlike the shift register 300 shown in FIG. 3, the shift register 600 shown in FIG. 6 may further include a reset sub-circuit 660. For simplicity and clarity of the description, only the reset sub-circuit 660 will be described in detail below, and for the remaining sub-circuits, reference will be made to the corresponding description set forth in conjunction with FIG. 3.

In some embodiments, the reset sub-circuit 660 may include a sixth transistor M6, a control terminal of which may be coupled to the reset signal terminal RESET, a first terminal of which may be coupled to the third voltage signal terminal LVGL, and a second terminal of which may be coupled to the pull-up node PU. In other words, the reset sub-circuit 660 may be configured to be able to transmit a third voltage signal from the third voltage signal terminal LVGL to the pull-up node PU under the control of a reset signal from the reset signal terminal RESET.

Figure 7:
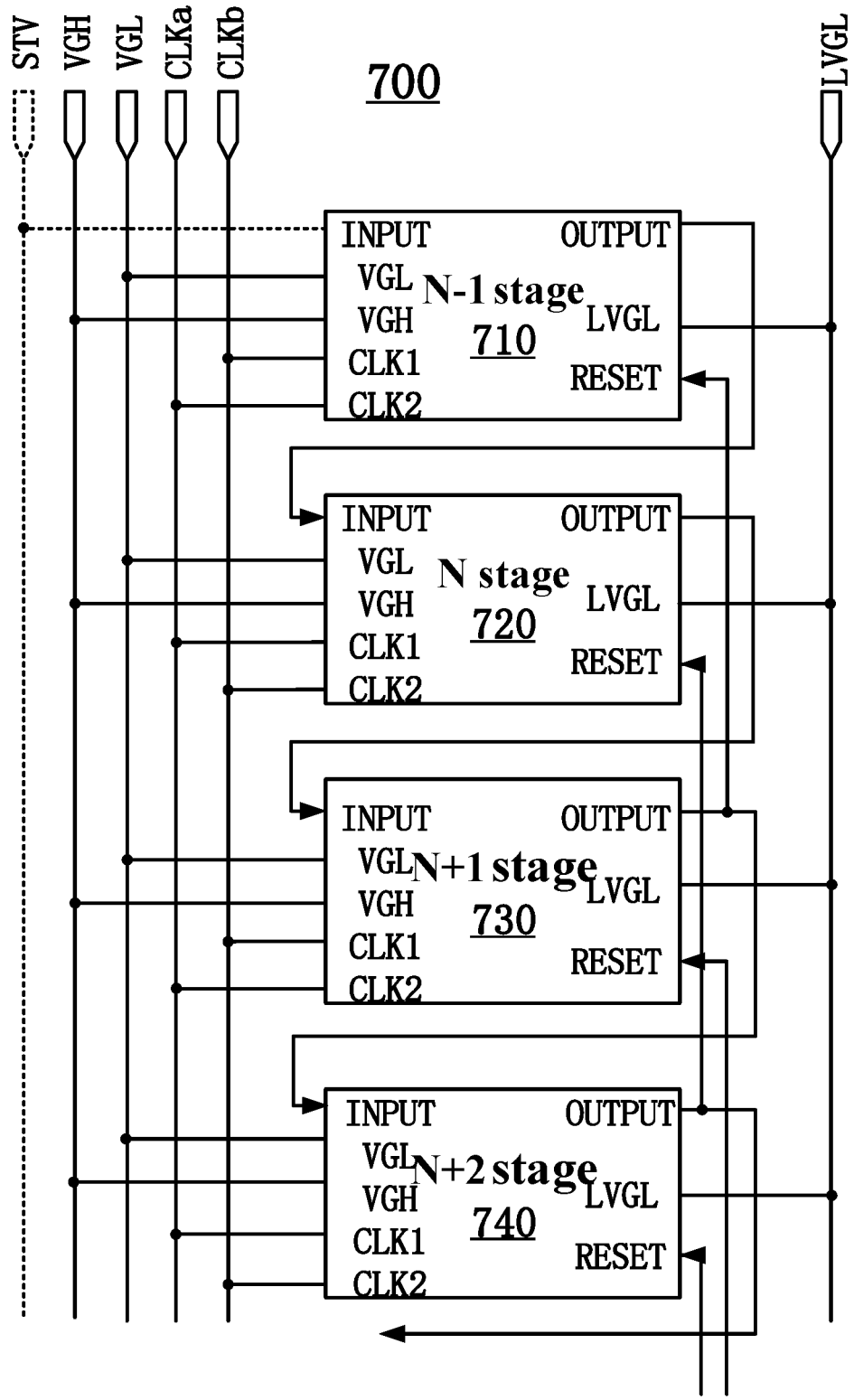
FIG. 7 is a schematic diagram showing another exemplary configuration of a gate driving circuit according to an embodiment of the present disclosure.

Next, another exemplary configuration of a gate driving circuit according to an embodiment of the present disclosure will be described with reference to FIG. 7. FIG. 7 is a schematic diagram showing an exemplary configuration of a gate driving circuit 700 according to an embodiment of the present disclosure. The gate driving circuit 700 may include a plurality of shift registers 710, 720, 730, 740 and the like, which are connected in cascade. While only four shift registers are shown in the embodiment as shown in FIG. 7, embodiments of the present disclosure are not limited thereto, and any number of shift registers may be employed. In some embodiments, each of the shift registers shown in FIG. 7 may be the shift register 200 as shown in FIG. 2 or the shift register 600 as shown in FIG. 6; however, the present disclosure is not limited thereto. In some other embodiments, in the gate driving circuit 700 shown in FIG. 7, some of the shift registers may be the shift registers 200 and/or 600 according to the embodiments of the present disclosure, and the others may be other shift registers which have been developed or will be developed in the future, such as the shift register 100.

Different from the gate driving circuit 400 shown in FIG. 4, each shift register in the gate driving circuit 700 shown in FIG. 7 further has a reset signal terminal RESET and a third voltage signal terminal LVGL and corresponding connections. For the sake of conciseness and clarity of the description, only the differences between FIG. 7 and FIG. 4 will be described. For connection relationships of other terminals, reference will be made to the corresponding description of FIG. 4.

As shown in FIG. 7, for each shift register at a current stage (e.g., a shift register 720 at a $N^{th}$ stage), its reset signal terminal RESET (N) is coupled to an output signal terminal OUTPUT (N+2) of a shift register at a following stage which is separated from the current stage by one stage (e.g., a shift register 740 at a $(N+2)^{th}$ stage). Similarly, a reset signal terminal RESET (N−1) of a shift register 710 at a $(N−1)^{th}$ stage is coupled to an output signal terminal OUTPUT (N+1) of a shift register 730 at a $(N+1)^{th}$ stage. In addition, for shift registers at the last two stages of the gate driving circuit 700, since there is no shift register at the following stage separated from the last two stages by one stage, a global reset signal terminal (e.g., the aforementioned STV signal) may be used to reset them. Alternatively, in yet other embodiments, these shift registers at the last two stages may adopt the design of the shift register 300 as shown in FIG. 3 without the need for the reset sub-circuit 660.

Furthermore, also as shown in FIG. 7, the third voltage signal terminal LVGL of each of the shift registers (e.g., shift registers 710, 720, 730, and 740) may be coupled to a LVGL line to receive a third voltage signal. In some embodiments, for example, in the case where an N-type transistor is used to form the shift register, the LVGL may be a low level signal that is lower than a threshold voltage of the transistor. Moreover, in yet other embodiments, the third voltage signal terminal LVGL may be coupled to a VGL line. In other words, the third voltage signal terminal LVGL and the second voltage signal terminal VGL can provide substantially the same voltage signal.

Next, an operation timing of the shift register 600 will be described in detail in conjunction with FIG. 8 based on the specific configuration of the shift register 600 as shown in FIG. 6 and the cascade relationship as shown in the gate driving circuit 700 in FIG. 7.

Figure 8:
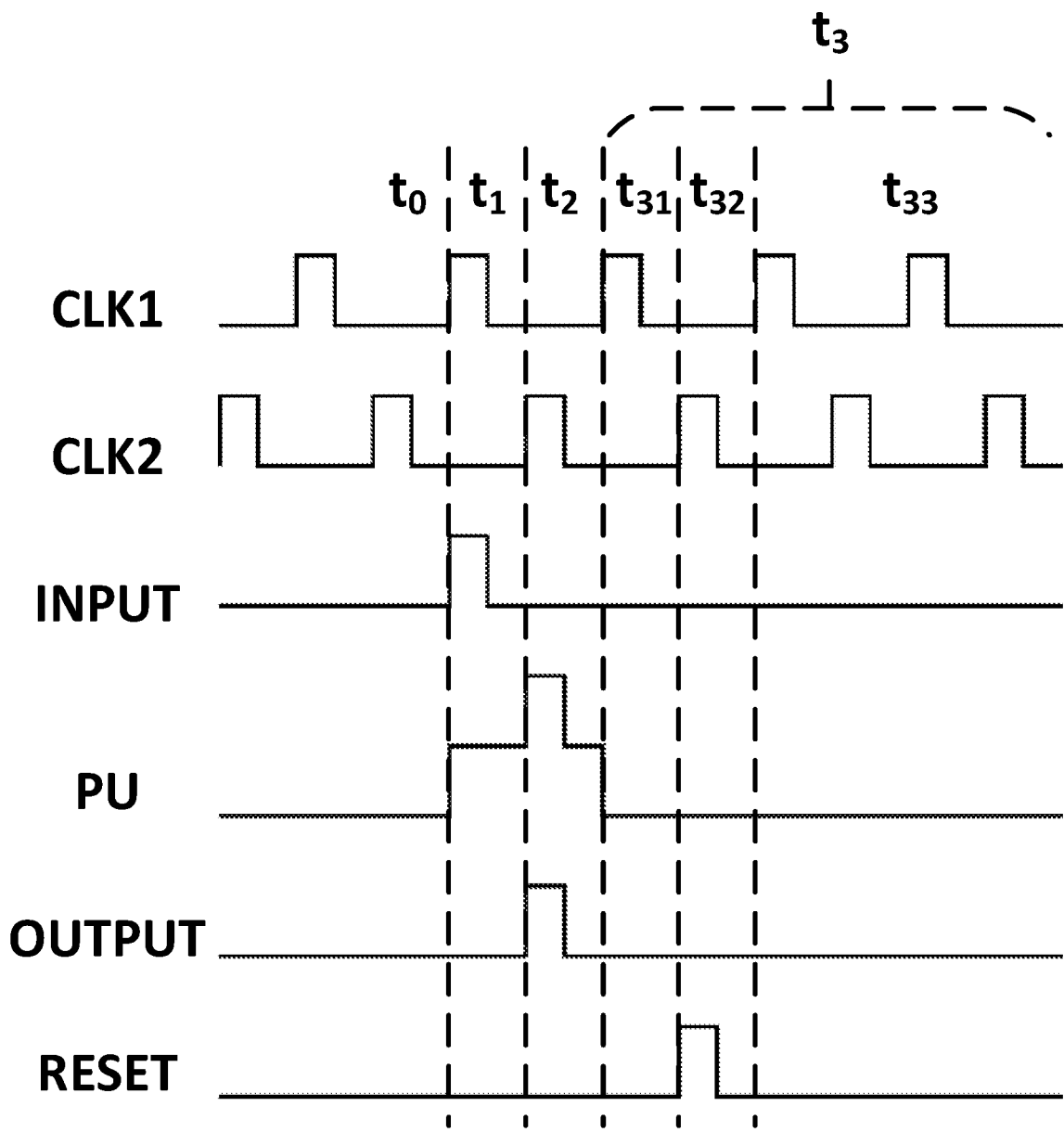
FIG. 8 shows an exemplary operation timing diagram of the shift register shown in FIG. 6.

FIG. 8 shows an exemplary operation timing diagram of the shift register 600 shown in FIG. 6, which has a cascade relationship as shown in FIG. 7 with other shift registers.

Similar to the operation timing diagram shown in FIG. 5, a period of one frame for the shift register 600 may be divided into four phases of $t_0$ to $t_3$, as shown in FIG. 8. It should be noted, however, that since the reset sub-circuit 660 is introduced, the third phase $t_3$ may be further subdivided into three sub-phases $t_{31}$, $t_{32}$ and $t_{33}$. Hereinafter, since the reset signal of the reset signal terminal RESET is not involved in a preparation phase to, a first phase $t_1$, and a second phase $t_2$, only the three sub-phases $t_{31}$, $t_{32}$ and $t_{33}$ of the third phase $t_3$ will be described for the conciseness and clarity of description. For the other phases, please refer to the corresponding description set forth in conjunction with FIG. 5.

In the first sub-phase $t_{31}$ of the third phase $t_3$, a low level is inputted at the input signal terminal INPUT, a high level is inputted at the first clock signal terminal CLK1, a low level is inputted at the second clock signal terminal CLK2, a low level is inputted at the reset signal terminal RESET, and a low level is outputted at the output signal OUTPUT.

More specifically, in the first sub-phase $t_{31}$, the high level is inputted at the first clock signal terminal CLK1 so that the first transistor M1, the third transistor M3, and the fifth transistor M5 are all turned on, thereby causing the low level input signal from the input signal terminal INPUT to be transmitted to the pull-up node PU through the third transistor M3, the feedback node FB and the first transistor M1. Further, the low level of the pull-up node PU causes both the second transistor M2 and the fourth transistor M4 to be turned off. The turn-off of the fourth transistor M4 causes the output signal terminal OUTPUT to be affected only by the low level from the second voltage signal terminal VGL due to the fifth transistor M5 which is turned on. In other words, the output signal terminal OUTPUT outputs a low level. At this time, the sixth transistor M6 of the reset sub-circuit 660 is turned off under the control of a low-level reset signal from the reset signal terminal RESET, thereby not affecting the pull-up node PU or even the entire shift register 600.

In the second sub-phase $t_{32}$ of the third phase $t_3$, a low level is inputted at the input signal terminal INPUT, a low level is inputted at the first clock signal terminal CLK1, a high level is inputted at the second clock signal terminal CLK2, and a high level is inputted at the reset signal terminal RESET, and a low level is outputted at the output signal OUTPUT.

More specifically, in the second sub-phase $t_{32}$, the low level is inputted at the first clock signal terminal CLK1 so that the first transistor M1, the third transistor M3, and the fifth transistor M5 are all turned off, and the high level is inputted at the reset signal terminal RESET so that the sixth transistor M6 is turned on. As a result, the pull-up node PU is at a low level due to the low level third voltage signal from the third voltage signal terminal LVGL, thereby achieving the effect of noise reduction and enabling the waveform to reach a low level more rapidly and steadily. Maintaining the pull-up node PU at the low level causes both the second transistor M2 and the fourth transistor M4 to remain turned off, and the turn-off of the fifth transistor M5 as previously mentioned causes the output signal terminal OUTPUT to maintain a voltage state of a preceding phase (i.e., the first sub-phase $t_{31}$ of the third phase $t_3$), that is, a state of outputting the low level.

In the third sub-phase $t_{33}$ of the third phase $t_3$, a low level is inputted at the input signal terminal INPUT, a high or low level is inputted at the first clock signal terminal CLK1, and a low or high level is correspondingly inputted at the second clock signal terminal CLK2, a low level is inputted at the reset signal terminal RESET, and a low level is outputted at the output signal terminal OUTPUT.

More specifically, this sub-phase $t_{33}$ is similar to the third phase $t_3$ in the operation timing diagram as shown in FIG. 5. In other words, since the reset signal terminal RESET always outputs a low level in this sub-phase $t_{33}$, the reset sub-circuit 660 does not have any influence on the entire shift register 600, and thus operates similarly to the shift register 300 as shown in FIG. 3.

Therefore, by using the shift register 600 in which the reset sub-circuit 660 is added, it is possible to keep the pull-up node PU and even the signal outputted from the output signal terminal OUTPUT of the shift register 600 at the low level more quickly and steadily, thereby providing a more stable output of a gate driving signal.

Hereinafter, a method for driving a shift register according to an embodiment of the present disclosure will be described in detail with reference to FIG. 9.

Figure 9:
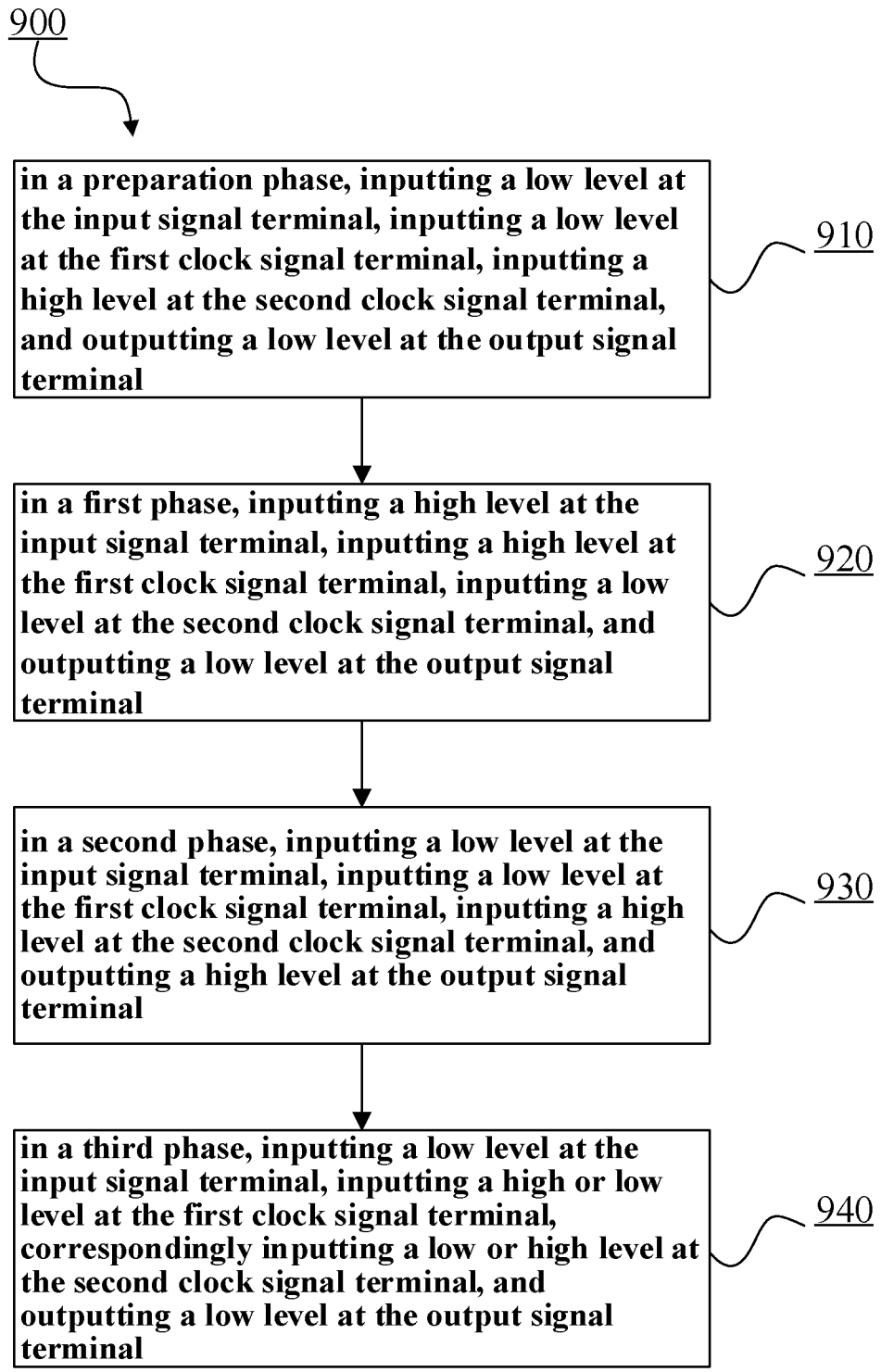
FIG. 9 is a flow chart showing an exemplary method for driving a shift register according to an embodiment of the present disclosure.

FIG. 9 is a flow chart showing an exemplary method 900 for driving the shift register 300 and/or 600 according to an embodiment of the present disclosure. As shown in FIG. 9, the method 900 may include, for example, steps S910, S920, S930, and S940. In accordance with the present disclosure, some of the steps of the method 900 may be performed separately or in combination, and may be performed in parallel or sequentially, and the performing sequence is not limited to the specific sequence of operations illustrated in FIG. 9. In some embodiments, the method 900 may be performed by the shift registers described herein or another external device.

In a period of one frame, the method 900 may include the following steps 910, 920, 930 and 940.

In step 910, in a preparation phase to, a low level may be inputted at the input signal terminal INPUT, a low level may be inputted at the first clock signal terminal CLK1, a high level may be inputted at the second clock signal terminal CLK2, and a low level may be outputted at the output signal terminal OUTPUT.

In step 920, in a first phase $t_1$, a high level may be inputted at the input signal terminal INPUT, a high level may be inputted at the first clock signal terminal CLK1, a low level may be inputted at the second clock signal terminal CLK2, and a low level may be outputted at the output signal terminal OUTPUT.

In step 930, in a second phase $t_2$, a low level may be inputted at the input signal terminal INPUT, a low level may be inputted at the first clock signal terminal CLK1, a high level may be inputted at the second clock signal terminal CLK2, and a high level may be outputted at the output signal terminal OUTPUT.

In step 940, in a third phase $t_3$, a low level may be inputted at the input signal terminal INPUT, a high or low level may be inputted at the first clock signal terminal CLK1, a low or high level may be correspondingly inputted at the second clock signal terminal CLK2, and a low level may be outputted at the output signal terminal OUTPUT.

Moreover, in some embodiments, if the shift register (e.g., the shift register 600) includes a reset sub-circuit (e.g., the reset sub-circuit 660), then the method 900 may further include the following steps in the third phase $t_3$.

In a first sub-phase $t_{31}$ of the third phase $t_3$, a low level may be inputted at the input signal terminal INPUT, a high level may be inputted at the first clock signal terminal CLK1, a low level may be inputted at the second clock signal terminal CLK2, a low level may be inputted at the reset signal terminal RESET, and a low level may be outputted at the output signal terminal OUTPUT.

In a second sub-phase $t_{32}$ of the third phase $t_3$, a low level may be inputted at the input signal terminal INPUT, a low level may be inputted at the first clock signal terminal CLK1, a high level may be inputted at the second clock signal terminal CLK2, a high level may be inputted at the reset signal terminal RESET, and a low level may be outputted at the output signal terminal OUTPUT.

In a third sub-phase $t_{33}$ of the third phase $t_3$, a low level may be inputted at the input signal terminal INPUT, a high or low level may be inputted at the first clock signal terminal CLK1, and a low or high level may be correspondingly inputted at the second clock signal terminal CLK2, a low level may be inputted at the reset signal terminal RESET, and a low level may be outputted at the output signal terminal OUTPUT.

Further, according to some embodiments of the present disclosure, a display device is further provided. The display device may include the aforementioned gate driving circuit (e.g., the gate driving circuit 400 and/or 700, etc.). The display device may include, but is not limited to, a liquid crystal display (LCD), an organic light emitting diode (OLED) display, a plasma display, a quantum dot display, and the like.

By using the shift register, the method for driving the shift register, the gate driving circuit, and the display device according to the embodiments of the present disclosure, the control of the potential of the pull-up node can be realized by replacing the pull-down node with a clock signal from the first clock signal terminal. As a result, the circuit design is simplified, which is suitable for high PPI display and narrow bezel requirements.

The present disclosure has been described in connection with some optional embodiments. It will be appreciated that various other changes, substitutions and additions may be made by those skilled in the art without departing from the spirit and scope of the present disclosure. Therefore, the scope of the present disclosure is not limited to the specific embodiments described above, but is defined by the appended claims.

In addition, the functions described herein as being implemented purely by hardware, software, and/or firmware may be implemented by dedicated hardware, a combination of general-purpose hardware and software, and the like. For example, functions described as being implemented by dedicated hardware (e.g., Field Programmable Gate Array (FPGA), Application Specific Integrated Circuit (ASIC), etc.) may be implemented by the combination of general-purpose hardware (e.g., central processing unit (CPU), digital signal processor (DSP)) with software and vice versa.

What is claimed is:

1. A circuit comprising:
    an input sub-circuit coupled to a first clock signal terminal, an input signal terminal and a feedback node, and configured to transmit an input signal from the input signal terminal to the feedback node under the control of a first clock signal from the first clock signal terminal;
    a pull-up node control sub-circuit coupled to the first clock signal terminal, the feedback node and a pull-up node, and configured to transmit a feedback signal of the feedback node to the pull-up node under the control of a first clock signal from the first clock signal terminal;
    a feedback sub-circuit coupled to the pull-up node, a first voltage signal terminal and the feedback node, and configured to transmit a first voltage signal from the first voltage signal terminal to the feedback node under the control of the pull-up node;
    an output sub-circuit coupled to the pull-up node, a second clock signal terminal and an output signal terminal, and configured to transmit a second clock signal from the second clock signal terminal to the output signal terminal under the control of the pull-up node; and
    a pull-down sub-circuit coupled to a pull-down node, a second voltage signal terminal and the output signal terminal, and configured to transmit a second voltage signal from the second voltage signal terminal to the output signal terminal under the control of the pull-down node.

2. The circuit according to claim 1, wherein the pull-up node control sub-circuit comprises:
    a first transistor having a control terminal coupled to the first clock signal terminal, a first terminal coupled to the feedback node, and a second terminal coupled to the pull-up node.

3. The circuit according to claim 1, wherein the feedback sub-circuit comprises:
    a second transistor having a control terminal coupled to the pull-up node, a first terminal coupled to the first voltage signal terminal, and a second terminal coupled to the feedback node; and
    a first capacitor having one end coupled to the pull-up node and the other end coupled to the first voltage signal terminal.

4. The circuit according to claim 1, wherein the input sub-circuit comprises:
    a third transistor having a control terminal coupled to the first clock signal terminal, a first terminal coupled to the input signal terminal, and a second terminal coupled to the feedback node.

5. The circuit according to claim 1, wherein the output sub-circuit comprises:
    a fourth transistor having a control terminal coupled to the pull-up node, a first terminal coupled to the second clock signal terminal, and a second terminal coupled to the output signal terminal; and
    a second capacitor having one end coupled to the pull-up node and the other end coupled to the output signal terminal.

6. The circuit according to claim 1, wherein the pull-down sub-circuit comprises:
    a fifth transistor having a control terminal coupled to the pull-down node, a first terminal coupled to the second voltage signal terminal, and a second terminal coupled to the output signal terminal.

7. The circuit according to claim 1, further comprising:
    a reset sub-circuit coupled to a reset signal terminal, a third voltage signal terminal and the pull-up node, and configured to transmit a third voltage signal from the third voltage signal terminal to the pull-up node under the control of a reset signal from the reset signal terminal.

8. The circuit according to claim 7, wherein the reset sub-circuit comprises:
    a sixth transistor having a control terminal coupled to the reset signal terminal, a first terminal coupled to the third voltage signal terminal, and a second terminal coupled to the pull-up node.

9. The circuit according to claim 7, wherein the third voltage signal from the third voltage signal terminal is substantially identical to the second voltage signal from the second voltage signal terminal.

10. The circuit according to claim 1, wherein each transistor is an N-type transistor, the first voltage signal is a high level signal, and the second and third voltage signals are low level signals;
  wherein the first and second clock signals each have a duty cycle less than or equal to 50%.

11. A circuit comprising:
  an input sub-circuit coupled to a first clock signal terminal, an input signal terminal and a feedback node, and configured to transmit an input signal from the input signal terminal to the feedback node under the control of a first clock signal from the first clock signal terminal;
  a pull-up node control sub-circuit coupled to the first clock signal terminal, the feedback node and a pull-up node, and configured to transmit a feedback signal of the feedback node to the pull-up node under the control of a first clock signal from the first clock signal terminal;
  a feedback sub-circuit coupled to the pull-up node, a first voltage signal terminal and the feedback node, and configured to transmit a first voltage signal from the first voltage signal terminal to the feedback node under the control of the pull-up node;
  an output sub-circuit coupled to the pull-up node and a free-end terminal, and configured to transmit a first signal to the free-end terminal under the control of the pull-up node; and
  a pull-down sub-circuit coupled to the free-end terminal, and configured to transmit a second signal which is different from the first signal to the free-end terminal.

12. The circuit according to claim 11, wherein the pull-up node control sub-circuit comprises:
  a first transistor having a control terminal coupled to the first clock signal terminal, a first terminal coupled to the feedback node, and a second terminal coupled to the pull-up node.

13. The circuit according to claim 11, wherein the feedback sub-circuit comprises:
  a second transistor having a control terminal coupled to the pull-up node, a first terminal coupled to the first voltage signal terminal, and a second terminal coupled to the feedback node; and
  a first capacitor having one end coupled to the pull-up node and the other end coupled to the first voltage signal terminal.

14. The circuit according to claim 11, wherein the input sub-circuit comprises:
  a third transistor having a control terminal coupled to the first clock signal terminal, a first terminal coupled to the input signal terminal, and a second terminal coupled to the feedback node.

15. The circuit according to claim 11, wherein the output sub-circuit comprises:
  a fourth transistor having a control terminal coupled to the pull-up node, a first terminal coupled to the second clock signal terminal, and a second terminal coupled to the free-end terminal; and
  a second capacitor having one end coupled to the pull-up node and the other end coupled to the free-end terminal.

16. The circuit according to claim 11, wherein the pull-down sub-circuit comprises:
  a fifth transistor having a control terminal coupled to the first clock signal terminal, a first terminal coupled to a second voltage signal terminal, and a second terminal coupled to the free-end terminal.

17. The circuit according to claim 11, further comprising:
  a reset sub-circuit coupled to a reset signal terminal, a third voltage signal terminal and the pull-up node, and configured to transmit a third voltage signal from the third voltage signal terminal to the pull-up node under the control of a reset signal from the reset signal terminal.

18. The circuit according to claim 17, wherein the reset sub-circuit comprises:
  a sixth transistor having a control terminal coupled to the reset signal terminal, a first terminal coupled to the third voltage signal terminal, and a second terminal coupled to the pull-up node.

19. The circuit according to claim 17, wherein the third voltage signal from the third voltage signal terminal is substantially identical to the second voltage signal from the second voltage signal terminal.

20. The circuit according to claim 11, wherein each transistor is an N-type transistor, the first voltage signal is a high level signal, and the second and third voltage signals are low level signals;
  wherein the first and second clock signals each have a duty cycle less than or equal to 50%.

* * * * *